METHOD OF MAKING THIN-FILM CIRCUITS

Filed Oct. 30, 1964

INVENTORS
CLYDE W. SKAGGS
CLIFFORD T. JEFFERSON, JR.
BY
Allen M. Sutton
ATTORNEY 3,423,205
Patented Jan. 21, 1969

3,423,205

METHOD OF MAKING THIN-FILM CIRCUITS

Clyde W. Skaggs and Clifford T. Jefferson, Jr., Canoga Park, Calif., assignors to The Bunker-Ramo Corporation, Stamford, Conn., a corporation of Delaware

Filed Oct. 30, 1964, Ser. No. 407,765
U.S. Cl. 96—36.2 11 Claims
Int. Cl. G03c *5/24;* C23f *1/02*

ABSTRACT OF THE DISCLOSURE

A method of fabricating a thin film circuit containing resistors and conductors. The method includes the steps of providing a substrate having an etchable film of resistive material thereon covered by an etchable film of conductive material. A first positive resist image of both resistors and conductors is fixed on the film of conductive material. Both the conductive and resistive material are then etched about the first resist image to remove the unprotected conductive and resistive material. The first positive resist image is then removed and a second positive resist image of just the conductors is fixed on the film of conductive material. The film of conductive material is then etched about the second resist image to remove the unprotected conductive material to define the resistors.

The present invention relates to a method of making thin-film circuits and, more particularly, to an improved photocopy process for making thin-film networks comprising resistors and conductors.

Thin-film circuits and their advantages are generally known in the art. Essentially, such circuits are formed by providing a layer of resistive material on a dielectric substrate plate and providing a layer of conductive material on top of the resistive material. The layers are then selectively etched to form the resistors and conductors on the substrate. According to one known method, a resist is applied to the layer of conductive material in the shape of the desired conductors and the remaining conductive material is then etched away. A resist is then applied in the shape of the desired resistors and the remaining resistive material is etched away to leave a desired network of resistors and conductors.

Difficulties have been experienced, however, with the finished product when made by heretofore known methods. The difficulties have resulted generally from a lack of precise definition of the resistors. This has been particularly troublesome in the case of very small networks wherein extremely close tolerances are required for the various resistors in the network. The present invention provides a method which obviates the difficulties heretofore experienced and which may be used to produce thin-film networks having resistors with very close tolerances.

Essentially, the method of the invention is based on a photocopy technique which provides for selectively etching the conductive and resistive layers carried by an insulating substrate. In the process, the outer conductive layer of material is coated with a photo-resist and is then exposed through a sharp photographic transparency of the complete circuit. After the photo-resist is developed and the unexposed photo-resist removed, the conductive and resistive material which is unprotected by the photo-resist is etched away. Following the etching process, the photo-resist is removed and a second coat of photo-resist is applied to the circuit. The second coat of photo-resist is then exposed through a photographic transparency of only the conductive paths. The second coat of photo-resist is then developed and the excess removed, and the unprotected conductive material is etched away to define the resistors in the circuit. The method of the invention provides that the transparencies through which the photo-resist is exposed are always in direct intimate contact with the photo-resist. This eliminates any spreading and provides extremely high definition of the shapes of the various elements comprising the thin-film network.

In accordance with another feature of the invention, the conductor transparency through which the second photo-resist is exposed to protect the conductors and define the resistors of the circuit defines conductors which are slightly larger than the actual conductors. This simplifies alignment of the conductor transparency with the network pattern and protects the conductor lands while defining the resistor length.

Other features and advantages of the invention will become apparent from the following description, taken in conjunction with the accompanying drawings, in which:

FIGURE 1 is a plan view of a greatly simplified thin-film network;

FIGURES 2(*a*) through 2(*d*) are plan views of photo-negatives utilized in the method of the invention;

Figure 1:
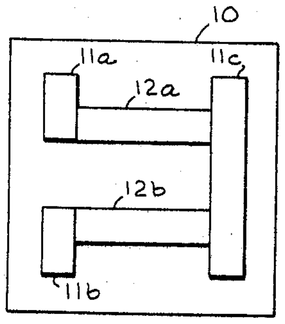

In the drawings, the thicknesses of the layers of resistive and conductive material are shown greatly exaggerated for purposes of illustration. It is understood that in actual practice the layers are exceedingly thin. Furthermore, the resistor-conductor network shown in the drawings is exceedingly simple in its configuration, this being done for clarity of illustration and explanation.

In the following description, reference will be made to exposing a photo-resist through a photographic negative. When the photo-resist is developed, it hardens in those areas where it has been exposed to provide a positive resist image of the photographic negative. Such a photo-resist, known as KPR, is manufactured and sold by Eastman Kodak Company, Rochester, N.Y. However, another type of photo-resist is manufactured and sold by the shipley Company, Inc., Wellesley, Mass. The latter type, when exposed and developed, hardens in the unexposed areas. Therefore, such a photo-resist would be exposed through a photographic positive rather than through a negative to provide a positive resist image of the photographic positive. The method of the invention contemplates the use of either type of photo-resist, although only the use of KPR will be described with reference to photographic negatives. It is understood that if the other type of photo-resist is used, the terms "negative" and "positive" would be interchanged in the following description.

Figure 2A:
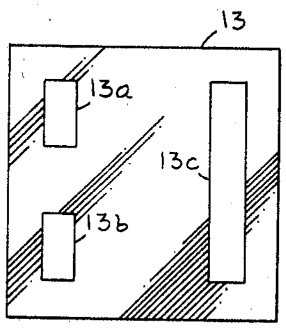
Figure 2B:
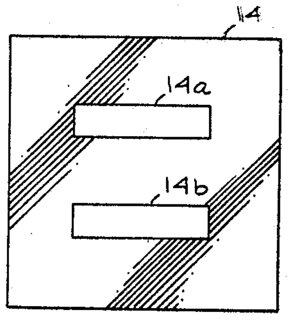

FIGURE 1 illustrates a simple thin-film resistor-conductor network carried on an insulating substrate 10 and comprising three conductors 11*a*–11*c* and two resistors 12*a*, 12*b*. It it is desired to make such a thin-film network according to the teachings of the invention, the first steps are to make separate sharp photographic negatives (photo-negatives) of the conductor pattern and the resistor pattern. Such photo-negatives designated 13 and 14 are shown in FIGURES 2*a* and 2*b*, respectively, where clear portions 13*a*–13*c* represent the conductors and clear portions 14*a*, 14*b* represent the resistors. The negatives may be made by conventional photographic technique from larger diagrams of the circuit.

Figure 2C:
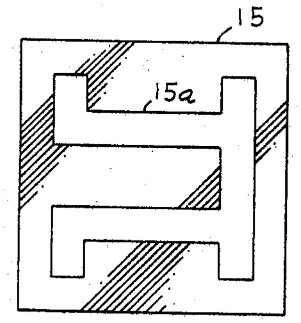
Figure 2D:
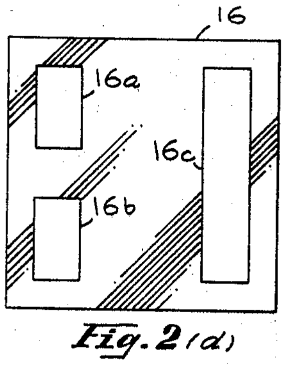

The conductor and resistor negatives 13 and 14 are utilized to make two more negatives, which are shown in FIGURES 2*c* and 2*d*. The resistor and conductor negatives are utilized to make two positives (not shown), from which a combination negative 15 is made. The negative 15 is a negative of the entire circuit, the circuit being represented by a clear portion 15*a*. The sharp conductor negative 13 is also utilized to make a "spread" negative 16, in which transparent areas 16*a*–16*c* defining the conductors are slightly larger than corresponding areas 13*a*–13*c* in the sharp negative 13. It has been found convenient to make the transparent areas 16*a*–16*c* in the spread negative 16 approximately 5 mils per edge larger than those of the sharp negative 13. The particular amount of spread may be varied as desired and the invention is not limited to any particular amount. The composite negative 15 may be made from the conductor and resistor negatives 13 and 14 by conventional photographic techniques; the spread negative 16 may be made utilizing apparatus such as is shown diagrammatically in FIGURE 3.

Figure 3:
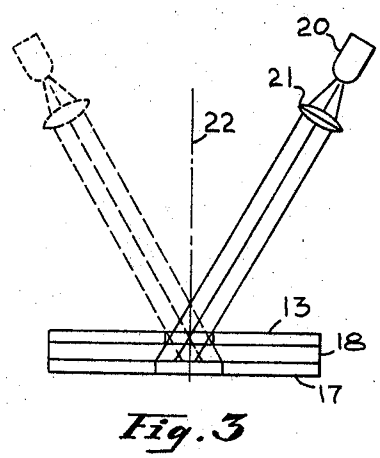
FIGURE 3 is a diagrammatic view of apparatus useful in making one of the negatives shown in FIGURE 2.

As shown in FIGURE 3, a spread positive 17 is first made from the sharp conductor negative 13. This may be accomplished by illuminating a piece of photographic film 17 with collimated light through the sharp negative 13 and a transparent spacer 18. A source of light 20 and a collimating lens 21 are placed to direct light through the conductor negative 13 at an appropriate angle. Spread from all edges of the transparent portion of the negative 13 may be obtained by rotating the assembly of the negative 13, spacer 18 and film 17 about an axis 22 perpendicular to the plane of the film or by rotating the light 20 and collimating lines 21 about the axis 22 as shown diagrammatically in the figure. After the film 17 has been exposed and developed to provide a spread positive, the spread negative 16 may be made by contact printing from the spread positive.

The sharp conductor and resistor negatives 13 and 14 are not again used in the process, which is carried out utilizing only the sharp composite negative 15 and the spread negative 16. The remainder of the process of forming a thin-film network according to the teachings of the invention will now be described with reference to FIGURES 4 through 7.

It is assumed that a laminar structure is provided including a substrate 25 having thereon an etchable film of resistive material 26 covered by an etchable film of conductive material 27. The method of making the laminar structure 24 is not part of the present invention, and it may be made by conventional techniques such as plating or vacuum deposition. The materials of which the films 26 and 27 are comprised is a matter of design choice, although the materials must be etchable. However, for purposes of example only, it is assumed that the resistive film 26 is chromium and the conductive film 27 is copper. It is also noted that in practice the conductive film may comprise several films, for example, gold-copper-gold, successively deposited.

Figures 4, 5, 6, 7:
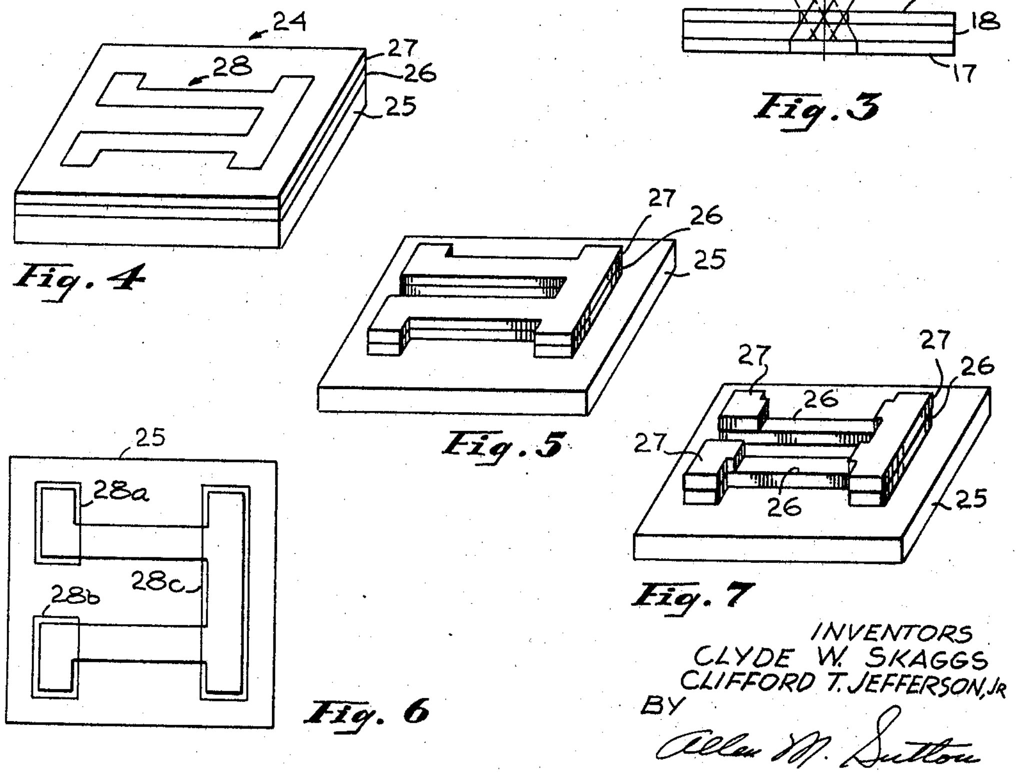
FIGURES 4 and 5 are perspective views of a thin-film circuit illustrating successive steps in the formation thereof.
FIGURE 6 is a plan view of a thin-film circuit illustrating another step in its manufacture.
FIGURE 7 is a perspective view of a completed thin-film network.

After the composite negative and the conductor spread negative have been obtained, the next step in the process is to coat the upper surface of the conductive film 27 with a photo-resist material. For purposes of illustration, it is assumed that the photo-resist is of a type which, when developed, is hardened in the areas that have been exposed, as previously pointed out. After the conductive film 27 is coated with the photo-resist, the sharp composite negative 15 is placed in direct contact with it and the photo-resist is exposed. The exposure itself is conventional and well known to those skilled in the art. After the photo-resist has been suitably exposed, it is developed and the unexposed photo-resist is washed away. This leaves a protective photo-resist pattern 28 in the form of a positive resist image of the entire circuit on the surface of the conductive film 27. The unprotected portions of the films 26 and 27 are then etched away to leave the complete circuit pattern as shown in FIGURE 5. The unprotected copper may be etched away with ferric-chloride and the chromium removed with hydrochloric acid. The chromium is etched by placing the assembly in hydrochloric acid and introducing an aluminum wire.

Following the etching process, the photo-resist is removed from the surface of the conductive film 27 and the assembly is suitably cleansed. The conductive film 27 is then again coated with a photo-resist. The conductor spread negative 16 is then placed in direct contact with the photo-resist and it is then exposed. After development, the unexposed photo-resist is washed off to leave a photo-resist pattern in the form of a positive resist image of the conductors (with a spread), such as is shown at 28*a*–28*c* in FIGURE 6. This image protects the conductors of the network, while defining the length of the resistors, and the unprotected copper is then etched away by the use of ferric-chloride to provide the finished network shown in FIGURE 7.

From a brief review of the invention, it is apparent that it possesses a number of advantages over methods of making thin-film circuits heretofore known. For example, the method of the invention is based on a photo-copy technique so that the transparencies used in the process may be used over and over again. Also, it is pointed out that a single transparency may have a number of different circuit images carried thereby so that the process is well adapted to mass production of thin-film circuits.

It is particularly pointed out that in both of the steps of the process in which a photo-resist is exposed to light, the transparency through which the exposure is made is in intimate direct contact with the photo-resist. Thus, there is minimum opportunity for spreading of the light directed through the transparency and exceedingly fine definition of the edges of the pattern is obtained. The use of a spread transparency for protecting the conductors and defining the exact length of the resistors is also most advantageous. Of course, the circuit is originally laid out and designed to provide for the slight overlap of the conductive material at each end of each resistor. Although not shown, it is clear that the substrate and thin-film network may be perforated at desired positions to provide for the connection of prefabricated components such as capacitors, transistors, and the like.

Although a preferred method has been illustrated and described, it is apparent that many changes and modifications may be made therein by one skilled in the art without departing from the true spirit and scope of the invention.

What is claimed is:

1. A method of making a thin-film circuit containing resistors and conductors from a laminated structure including a substrate having thereon an etchable film of resistive material covered by an etchable film of conductive material, the method comprising the steps of:
   - fixing a first positive resist image of both resistors and conductors on the film of conductive material,
   - etching both the films of conductive material and resistive material about said first resist image to remove the unprotected conductive and resistive material,
   - removing the first positive resist image,
   - fixing a second positive resist image of said conductors on the film of conductive material, and
   - etching the film of conductive material about said second resist image to remove the unprotected conductive material and define resistors.

2. The method by claim 1, wherein said second positive resist image of said conductors is slightly larger than said conductors.

3. A method of making a thin-film circuit containing resistors and conductors from a laminated structure including a substrate having thereon an etchable film of resistive material covered by an etchable film of conductive material, the method comprising the steps of:
   - making a first photographic transparency of a desired conductor pattern, making a second photographic transparency of said desired conductor pattern and a desired resistor pattern, fixing a first positive resist image of said second photographic transparency on the film of conductive material, etching both the films of conductive material and resistive material about said first resist image to remove the unprotected conductive and resistive material, removing said first resist image, fixing a second positive resist image of said second photographic transparency on the film of conductive material, and etching the film of conductive material about said second resist image to remove the unprotected conductive material and define resistors.

4. A method of making a thin-film circuit containing resistors and conductors from a laminated structure including a substrate having thereon an etchable film of resistive material covered by an etchable film of conductive material, the method comprising the steps of:

making a first photographic transparency of a desired conductor pattern, making a second photographic transparency of said desired conductor pattern and a desired resistor pattern, making a third photographic transparency from said first photographic transparency which is slightly larger than said first photographic transparency, fixing a first positive resist image of said second photographic transparency on the film of conductive material, etching both the films of conductive material and resistive material about said first resist image to remove the unprotected conductive and resistive material, removing said first resist image, fixing a second positive resist image of said third photographic transparency on the film of conductive material, and etching the film of conductive material about said second resist image to remove the unprotected conductive material and define resistors.

5. A method of making a thin-film circuit containing resistors and conductors from a laminated structure including a substrate having thereon an etchable film of resistive material covered by an etchable film of conductive material, the method comprising the steps of:

making a first photographic transparency of a desired resistor pattern, making a second photographic transparency of a desired conductor pattern, making a third photographic transparency which is a composite of said first and second photographic transparencies, fixing a first positive resist image of said third photographic transparency on the film of conductive material, etching both the films of conductive material and resistive material about said first resist image to remove the unprotected conductive and resistive materials, removing said first resist image, fixing a second positive resist image of said second photographic transparency on the film of conductive material, and etching the film of conductive material about said second resist image to remove the unprotected conductive material and define resistors.

6. A method of making a thin-film circuit containing resistors and conductors from a laminated structure including a substrate having thereon an etchable film of resistive material covered by an etchable film of conductive material, the method comprising the steps of:

making a first photographic transparency of a desired resistor pattern, making a second photographic transparency of a desired conductor pattern, making a third photographic transparency which is a composite of said first and second photographic transparencies, making a fourth photographic transparency from said second photographic transparency which is slightly larger than said second photographic transparency, fixing a first positive resist image of said third photographic transparency on the film of conductive material, etching both the films of conductive material and resistive material about said first resist image to remove the unprotected conductive and resistive materials, removing said first resist image, fixing a second positive resist image of said fourth photographic transparency on the film of conductive material, and etching the film of conductive material about said second resist image to remove the unprotected conductive material and define resistors.

7. A method of making a thin-film circuit containing resistors and conductors from a laminated structure including a substrate having thereon an etchable film of resistive material covered by an etchable film of conductive material, the method comprising the steps of:

making a first photo-negative of a desired resistor pattern, making a second photo-negative of a desired conductor pattern, making a third photo-negative which is a composite of said first and second photo-negatives, fixing a first positive photo-resist image of said third photo-negative on the film of conductive material, etching both the films of conductive material and resistive material about said first resist image to remove the unprotected conductive and resistive material, removing said first photo-resist image, fixing a second positive photo-resist image of said second photo-negative on the film of conductive material, and etching the film of conductive material about said second photo-resist image to remove the unprotected conductive material and define resistors.

8. A method of making a thin-film circuit containing resistors and conductors from a laminated structure including a substrate having thereon an etchable film of resistive material covered by an etchable film of conductive material, the method comprising the steps of:

making a first photo-negative of a desired resistor pattern, making a second photo-negative of a desired conductor pattern, making a third photo-negative which is a composite of said first and second photo-negatives, making a fourth photo-negative from said second photo-negative which is slightly larger than said second photo-negative, fixing a first positive photo-resist image of said third photo-negative on the film of conductive material, etching both the films of conductive material and resistive material about said first photo-resist image to remove the unprotected conductive and resistive material, removing said first photo-resist image, fixing a second positive photo-resist image of said fourth photo-negative on the film of conductive material, and etching the film of conductive material about said second photo-resist image to remove the unprotected conductive material and define resistors.

9. A method of making a thin-film circuit containing resistors and conductors from a laminated structure including a substrate having thereon an etchable film of resistive material covered by an etchable film of conductive material, the method comprising the steps of:

making a first photo-negative of a desired conductor pattern, making a second photo-negative of said desired conductor pattern and a desired resistor pattern, coating a photo-resist on said film of conducting material, exposing said photo-resist through said second photo-negative, developing said photo-resist to fix a first positive resist image of said second photo-negative on the film of conductive material, etching both the films of conductive material and resistive material about said first resist image to remove the unprotected conductive and resistive material, removing said first resist image, again coating a photo-resist on said film of conducting material, exposing said photo-resist through said first photo-negative, developing said photo-resist to fix a second positive resist image of said first photo-negative on the film of conductive material, and etching the film of conductive material about said second resist image to remove the unprotected conductive material and define resistors.

10. A method of making a thin-film circuit containing resistors and conductors from a laminated structure including a substrate having thereon an etchable film of resistive material covered by an etchable film of conductive material, the method comprising the steps of:

making a first photo-negative of a desired resistor pattern, making a second photo-negative of a desired conductor pattern, making a third photo-negative which is a composite of said first and second photo-negatives, coating a photo-resist on said film of conductive material, exposing said photo-resist through said third negative, developing said photo-resist to fix a first positive resist image of said third photo-negative on the film of conductive material, etching both the films of conductive material and resistive material about said first resist image to remove the unprotected conductive and resistive material, removing said first resist image, again coating a photo-resist on said film of conductive material, exposing said photo-resist through said second photo-negative, developing said photo-resist to fix a second positive resist image of said second photo-negative on the film of conductive material, and etching the film of conductive material about said second resist image to remove the unprotected conductive material and define resistors.

11. A method of making a thin-film circuit containing resistors and conductors from a laminated structure including a substrate having thereon an etchable film of resistive material covered by an etchable film of conductive material, the method comprising the steps of:

making a first photo-negative of a desired resistor pattern, making a second photo-negative of a desired conductor pattern, making a third photo-negative which is a composite of said first and second photo-negatives, making a fourth photo-negative from said second photo-negative which is slightly larger than said second photo-negative, coating a photo-resist on said film of conductive material, exposing said photo-resist through said third photo-negative, developing said photo-resist to fix a first positive resist image of said third photo-negative on the film of conductive material, etching both the films of conductive material and resistive material about said first resist image to remove the unprotected conductive and resistive material, removing said first resist image, again coating a photo-resist on said film of conductive material, exposing said photo-resist through said fourth photo-negative, developing said photo-resist to fix a second positive resist image of said fourth photo-negative on the film of conductive material, and etching the film of conductive material about said second resist image to remove the unrpotected conductive material and define resistors.

References Cited

UNITED STATES PATENTS

| | | | |
|---|---|---|---|
| 3,061,911 | 11/1962 | Baker | 29—155.5 |
| 3,095,340 | 6/1963 | Triller | 156—8 |
| 3,264,105 | 8/1966 | Houtz | 96—36.2 |

FOREIGN PATENTS

| | | |
|---|---|---|
| 518,373 | 11/1955 | Canada. |

OTHER REFERENCES

Skaggs, "Photoetching Thin-Film Circuits, " 1964, electronics, June 15, 1964, pp. 94–98.

NORMAN G. TORCHIN, *Primary Examiner.*

R. E. MARTIN, *Assistant Examiner.*

U.S. Cl. X.R.

156—3, 11